(12) United States Patent
Kumar et al.

(10) Patent No.: US 10,491,243 B2
(45) Date of Patent: Nov. 26, 2019

(54) DEEP LEARNING FOR LOW-DENSITY PARITY-CHECK (LDPC) DECODING

(71) Applicant: SK Hynix Inc., Gyeonggi-do (KR)

(72) Inventors: Naveen Kumar, San Jose, CA (US); Aman Bhatia, San Jose, CA (US); Chenrong Xiong, San Jose, CA (US); Yu Cai, San Jose, CA (US); Fan Zhang, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 108 days.

(21) Appl. No.: 15/607,242

(22) Filed: May 26, 2017

(65) Prior Publication Data
US 2018/0343017 A1 Nov. 29, 2018

(51) Int. Cl.
| H03M 13/11 | (2006.01) |
| G06N 3/02 | (2006.01) |
| G06F 11/10 | (2006.01) |
| H03M 13/00 | (2006.01) |
| G06N 3/04 | (2006.01) |
| G06N 3/08 | (2006.01) |
| H03M 13/45 | (2006.01) |
| H03M 13/37 | (2006.01) |
| H03M 13/25 | (2006.01) |

(52) U.S. Cl.
CPC ..... *H03M 13/1108* (2013.01); *G06F 11/1012* (2013.01); *G06N 3/02* (2013.01); *G06N 3/0454* (2013.01); *G06N 3/08* (2013.01); *H03M 13/1111* (2013.01); *H03M 13/6597* (2013.01); *H03M 13/1105* (2013.01); *H03M 13/1128* (2013.01); *H03M 13/1154* (2013.01); *H03M 13/255* (2013.01); *H03M 13/3746* (2013.01); *H03M 13/45* (2013.01)

(58) Field of Classification Search
CPC .......... H03M 13/1108; H03M 13/1111; H03M 13/1128; H03M 13/3746; H03M 13/1102; H03M 13/1105; H03M 13/255; H03M 13/1154; H03M 13/45; G06N 3/02
See application file for complete search history.

(56) References Cited

U.S. PATENT DOCUMENTS

2003/0033570 A1* 2/2003 Khannanov ........ H03M 13/1102
714/755
2015/0349807 A1* 12/2015 Vernon ............... H03M 13/353
714/774

OTHER PUBLICATIONS

Karami et al, Multi Layer Perceptron Neural Networks Decoder for LDPC Codes, 2009, IEEE, 2009 5th International Conference on Wireless Communications, Networking and Mobile Computing, pp. 1-4. (Year: 2009).*

* cited by examiner

*Primary Examiner* — April Y Blair
*Assistant Examiner* — Sazzad Hossain
(74) *Attorney, Agent, or Firm* — Kilpatrick Townsend & Stockton LLP

(57) ABSTRACT

Techniques for improving the bit error rate (BER) performance of an error correction system are described. In an example, the error correction system implements low-density parity-check (LDPC) decoding that uses bit flipping. In a decoding iteration, a feature map is generated for a bit of an LDPC codeword. The bit corresponds to a variable node. The feature map is input to a neural network that is trained to determine whether bits should be flipped based on corresponding feature maps. An output of the neural network is accessed. The output indicates that the bit should be flipped based on the feature map. The bit is flipped in the decoding iteration based on the output of the neural network.

20 Claims, 9 Drawing Sheets

DEEP LEARNING FOR LOW-DENSITY PARITY-CHECK (LDPC) DECODING

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND

Low density parity check (LDPC) codes are prevalently used in data storage technologies and data transmission technologies for providing data integrity. Message passing decoders are commonly used for decoding LDPC codes. These decoders provide good error correction capability at the cost of complex silicon on chip (SoC) implementation.

Existing systems use various bit flipping (BF) decoders that flip the bits based on information available for variable nodes. BF decoders are easy to implement on hardware and provide significant area and power savings.

Generally, a BF decoder uses a set of rules to decide whether a bit should be flipped or not. The rules are generated heuristically. The correction capability, such as the bit error rate (BER) performance of the BF decoder depends on the used rules. In many situations, it is challenging to find, at least heuristically, the set of rules that achieves a particular BER performance. For example, irregular LDPC codes have degrees (e.g., number of connected check nodes) that vary across the variable nodes. The variability in the degrees exacerbate the challenge of generating the proper rules to achieves the particular BER performance.

BRIEF SUMMARY

Techniques for improving the bit error rate (BER) performance of an error correction system are described. In an example, the error correction system implements LDPC decoding that uses bit flipping. Rather than using heuristics rule to determine whether a bit that corresponds to a variable node should be flipped or not, the error correction system uses a neural network. The neural network is trained for bit flipping. In a decoding iteration, the error correction system generates a feature map for the bit and inputs the feature map to the neural network. The error correction system accesses an output of the neural network. The output indicates that the bit should be flipped based on the feature map. The error correction system flips the bit in the decoding iteration based on the output of the neural network.

In an example, the neural network is trained for the bit flipping according to a multi-stage approach. In a first training stage, training bits are separated between correct bits and error bits. The correct bits are sampled at a first sampling rate to generate sample correct bits. The error bits are also sampled at a second sampling rate to generate sample error bits. To properly train the neural network, the second sampling rate is smaller than the first sampling rate. Feature maps for the sample correct bits and sample error bits are generated and are input to the neural network in the first training stage. In a second training stage, the training bits are sampled at a third sampling rate to generate sample training bits. Features maps are also generated for the sample training bits. Once the training is complete in the first training stage, these features maps are provided as additional input to the neural network to further train it.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
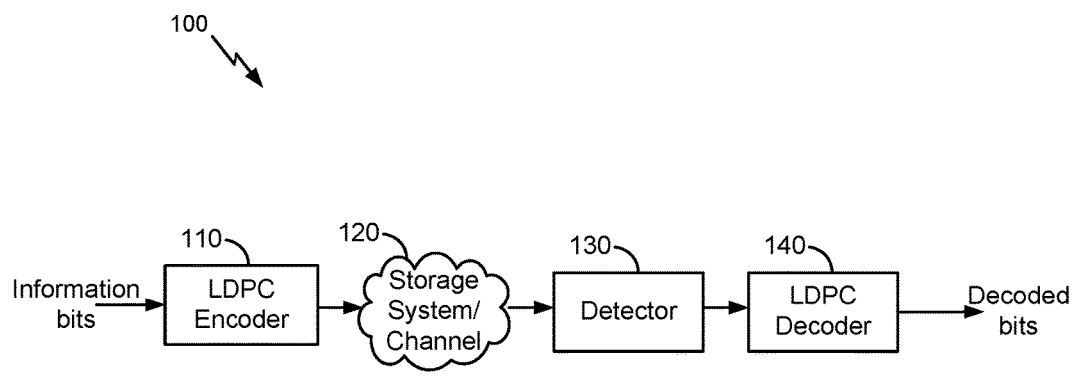
FIG. 1 illustrates an example high level block diagram of an error correcting system, in accordance with certain embodiments of the present disclosure.

Generally, LDPC decoding uses an iterative decoding procedure. In each decoding iteration, bits are decoded. A bipartite graph, such as a Tanner graph, that includes variable nodes and check nodes can be used for the decoding. The decoded bits correspond to the variable nodes. For each of the bits, a decision is generated as to whether that bit should be flipped or not. Existing systems uses heuristics rules to generate the decision.

To improve the BER performance associated with LDPC decoding, and more specifically the BER performance associated with bit flipping, embodiments of the present disclosure involve a deep learning method for generating the decision as to whether a bit should be flipped or not. In an example, a neural network is trained to output an indication as to whether a bit should be flipped or not. Once trained, the neural network is used by a decoder (e.g., an LDPC decoder or a BF decoder that is part of the LDPC decoder). In a decoding iteration, the decoder generates a feature map for a bit based on a variable node that corresponds to the bit and inputs the feature map to the neural network. The neural network outputs the relevant indication based on the feature. If the indication is to flip, the decoder flips the bit. Otherwise, the decoder skips the flipping.

Accordingly, rather than using heuristic rules for bit flipping, a neural network is used. Because this network is trained to determine whether the bit flipping is proper or not given features of a bit, the BER performance can be improved. The improvements are significant for irregular LDPC codes where, typically, optimizing the heuristic rules is very challenging or using the heuristic rules may not achieve a desired BER performance.

A challenge for using a neural network is training it. More specifically, the neural network should be trained to achieve a desired BER performance. The smaller the BER, the better the performance is, but the more challenging the training becomes because of the smaller number of errors. To illustrate, a $10^{-4}$ BER indicates that in every 10,000 bits, there is one error bit. Simply training the neural network with training codewords that have one error bit in every 10,000 bits would not be beneficial. That is because the training would improperly bias the neural network (e.g., set its weights and other parameters) based on the much larger amount of correct bits such that the trained neural network would fail to detect the error bits.

Instead, data sampling is used. More specifically, the training codewords include training bits. Because these bits are training bits, the locations of the errors in the training bits are known. Hence, the training bits can be separated between correct bits and error bits given the known locations. The correct bits are sampled at a first sampling rate to generate sample correct bits and the error bits are sampled at a second sampling rate to generate sample error bits. The sample correct bits and the sample error bits are used to train the neural network instead of the training bits. To deal with the improper bias, the second sampling rate is smaller than the first sampling rate such that the ratio between the amount of sample correct bits to the amount of sample error bits is much larger than the original ratio of the amount of correct bits to the amount of error bits in the training data. In this way, more error bits and less correct bits would be available in the training, thereby reducing or even eliminating the improper bias.

To illustrate, consider an example of three-hundred LDPC codewords, each including 2,000 bits. The neural network is trained for a $10^{-4}$ BER. Hence, there are sixty error bits and 599,940 correct bits in the training data. The sampling rate for the error bits is set to two, resulting in thirty sample error bits. The sampling rate for the correct bits is set to one thousand resulting in about six-hundred sample correct bits. The thirty sample error bits and the six-hundred sample correct bits are input to the neural network for the training.

However, by sub-sampling the training bits, some information may be lost and the training can be partial. To further improve the training, a second training stage can be used. In the second stage, the original training bits are sampled at a third sampling rate to generate sample training bits. The sample training bits are input to the neural network (after its training is complete in the first training stage that uses sample correct bits and sample error bits), thereby further updating the parameters of the neural network to complete the training. Referring back to the illustrative example, the third sampling rate can be set to six hundred. In this case, one thousand sample training bits would be used to further train the neural network in the second training stage.

In the interest of clarity of explanation, the embodiments of the present disclosure are described in connection with LDPC decoding. However, the embodiments are not limited as such and apply to other decoding procedures that rely on bit flipping. Generally, a decoding procedure may involve a bit flipping operation. For this operation, a feature map is generated for a bit and is input to the neural network. The bit is flipped depending on the output from the neural network.

In also the interest of clarity of explanation, the embodiments of the present disclosure are described in connection with training and using a neural network for bit flipping. However, the embodiments are not limited as such and apply to other decoding operations. For example, and in addition to a first neural network trained for bit flipping, a second neural network is trained and used for stuck error patterns to correct such stuck error patterns. Here, the training of the first neural network uses a first training set of feature maps, where the features relate to information used in the bit flipping (e.g., number of unsatisfied check nodes). The training of the second neural network also uses a second training set of feature maps. However, these features relate to information used in stuck error pattern correction (e.g., correction capability, error intersections, failed codewords, information to perform erasure). In operation, the respective features maps are input to each of the neural networks.

FIG. 1 illustrates an example high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to the number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer search or algebraic constructions are possible. The random computer search construction describes an LDPC code having a parity-check matrix designed by a random computer-based procedure. Algebraic construction implies that the parity-check matrix has been constructed based on combinatorial methods.

Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic) disk drive storage, Flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. In many situations, the decoding is iterative and the LDPC decoder 140 implements a BF decoder (e.g., performs bit flipping operations). In such situations, at each decoding iteration, a decision is made as to whether a bit should be flipped or not, and a flipping operation is performed or skipped based on the decision. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the code word and the other set of nodes, e.g., check nodes, correspond to the set of parity-check constraints satisfied by the code words. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a code word by p results in another code word. Here p is the size of a square matrix which is either a zero matrix or a circulant matrix. This is a generalization of a cyclic code in which a cyclic shift of a code word by 1 results in another code word. The block of p×p matrix can be a zero matrix or cyclically shifted identity matrix of size p×p.

Figures 2A, 2B:
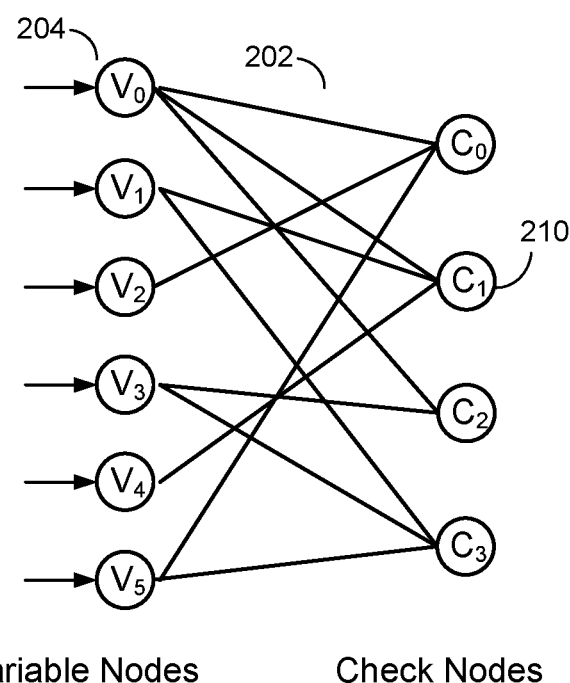
FIGS. 2A-2B illustrate an example parity-check matrix and an example graph representing the parity-check matrix, in accordance with certain embodiments of the present disclosure.

FIG. 2A illustrates an example parity-check matrix H 200 and FIG. 2B illustrates an example bipartite graph corresponding to the parity-check matrix 200, in accordance with certain embodiments of the present disclosure. In this example, the parity-check matrix 200 has six column vectors and four row vectors. Network 202 shows the network corresponding to the parity-check matrix 200 and represents a bipartite graph. Various types of bipartite graphs are possible including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates the corresponding check node and variable nodes have a connection. A "0" indicates there is no connection. For example, the "1" in the leftmost column vector and the second row vector from the top in the parity-check matrix 200 corresponds to the connection between the variable node 204 and the check node 210. FIGS. 2A and 2B illustrate parity-check matrix and a network for a regular LDPC code. As shown in FIG. 2B, each variable node is connected to a same number of check nodes and, thus, the LDPC code is regular. For irregular LDPC code, the number of connections varies across the variable nodes. Generally, the number of connections can be referred to as the degree of the LDPC code.

A message passing algorithm is generally used to decode LDPC codes. Several variations of the message passing algorithm exist in the art, such as min-sum algorithm, scaled min-sum algorithm, or the like. In general, any of the variations of the message passing algorithm may be used in an LDPC decoder without departing from the teachings of the present disclosure. Message passing uses a network of variable nodes and check nodes, as shown in FIG. 2B. The connections between variable nodes and check nodes are described by and correspond to the values of the parity-check matrix 200, as shown in FIG. 2A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo two).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found or a maximum number of iterations are performed without finding a correct codeword. It should be noted that a soft-decision decoder works similarly, however, each of the messages that are passed among check nodes and variable nodes, also include reliability of each bit.

An example message passing algorithm may be performed. In this example, L(qij) represents a message that is sent by variable node $v_i$ to check node $c_j$; L($r_{ji}$) represents the message sent by check node $c_j$ to variable node $v_i$; and (L($c_i$) represents initial LLR value for each variable node $v_i$. Variable node processing for each L(qij) can be done through the following steps:
(1) Read L($c_i$) and L($r_{ij}$) from memory.
(2) Calculate L(Qi-sum)=L($c_i$)+Scaling Factor*$\Sigma_{j' \in c_i}$L($r_{ij}$).
(3) Calculate each L(Qi-sum)−L($r_{ij}$).
(4) Output L(Qi-sum) and write back to memory.
(5) If this is not the last column of the memory, go to Step 1 and increment i by one.
(6) Compute parity-check-sums, if they are all equal to zero or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj-sum) = \left(\prod_{i' \in R_j} \alpha_{i'j}\right) \phi\left(\sum_{i' \in R_j} \phi(\beta_{i'j})\right)$$

$$\alpha_{ij} = \text{sign}(L(q_{ij})), \beta_{ij} = |L(q_{ij})|,$$

$$\phi(x) = -\log\left(\tanh\left(\frac{x}{2}\right)\right) = \log\left(\frac{e^x + 1}{e^x - 1}\right)$$

(3) Calculate the individual L($r_{ji}$)=($\prod_{i' \in R_{ji}} \alpha_{i'j}$) $\emptyset(\Sigma_{i' \in R_{ji}} \emptyset$ ($\beta_{i'j}$) for check nodes.
(4) Write back L($r_{ji}$) to memory.
(5) If this is not the last row of memory, then go to the first step and increment j by one.

In addition to the message passing algorithm, a bit flipping algorithm is used. The bit flipping algorithm generally flips bits with the goal of satisfying the parity-check equations to correct errors. In an illustration, a check node is connected to variable nodes and is associated with a parity-check equation. Each of the variable nodes corresponds to a bit. The parity-check equation is unsatisfied when the check node is unsatisfied. In turn, the check node is unsatisfied when the modulo two sum of the bits represented by the variable nodes is not zero. Bit flipping attempts to minimize the total number of unsatisfied check nodes, and thus, the total number of unsatisfied parity equations by flipping bits of the variable nodes. For example, and referring back to the illustrative check node, if that check node is unsatisfied, a bit represented by a connected variable node is flipped. By flipping this bit, the modulo two sum becomes zero and, thus, the check node and the parity-check equations are satisfied. Of course, flipping the bit cannot be random. Instead, various techniques are used to identify the bits that should be flipped. Existing systems use, for example, heuristics rules. According to the heuristics rules, a bit is flipped if its variable node is connected to a number of unsatisfied check nodes and if that number exceeds a threshold. Otherwise, the bit is not flipped. In comparison, embodiments of the present disclosure use a neural network for the bit flipping as further described in the next figures.

Figure 3:
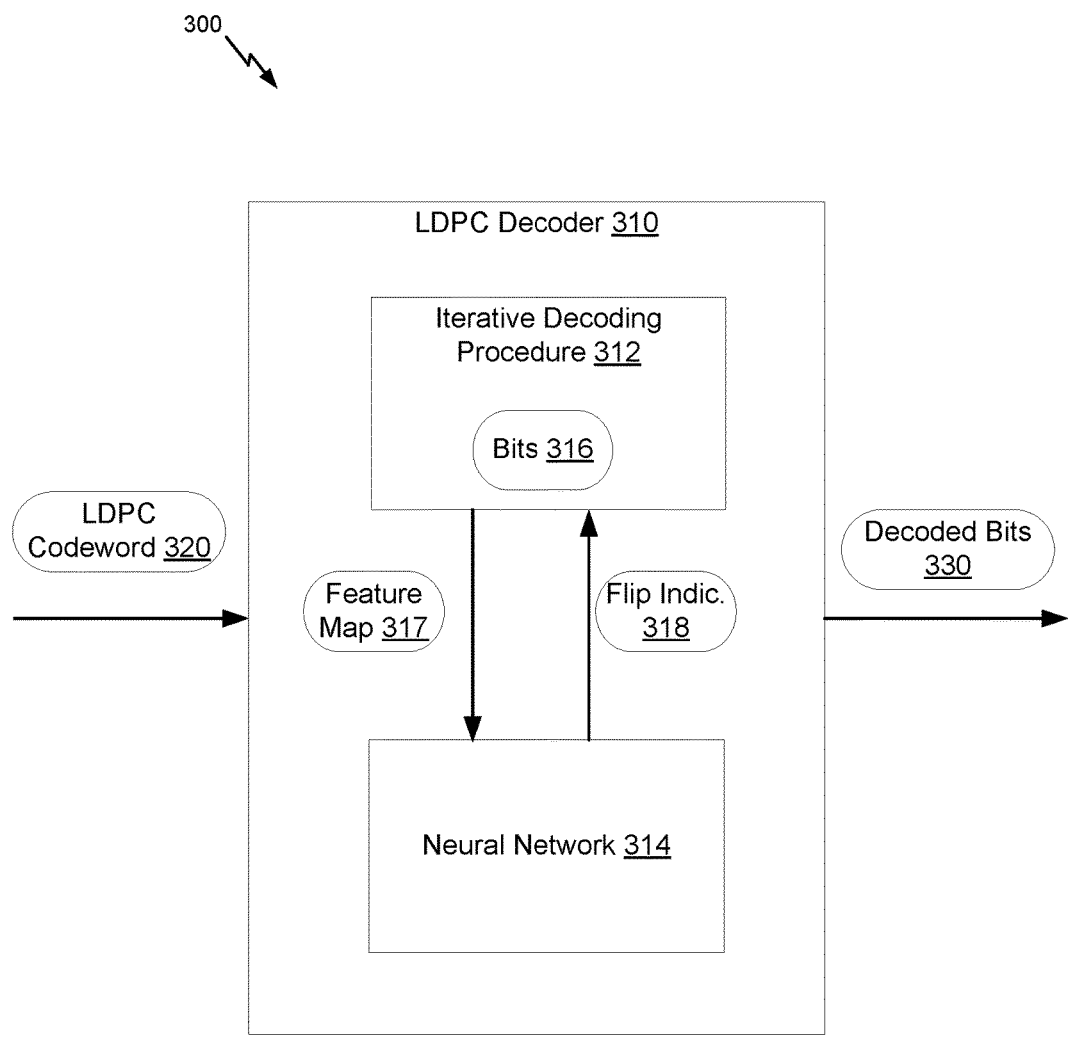
FIG. 3 illustrates an example diagram for decoding LDPC codewords, in accordance with certain embodiments of the present disclosure.

FIG. 3 illustrates an example diagram 300 for decoding LDPC codewords, in accordance with certain embodiments of the present disclosure. As illustrated, an LDPC decoder 310 (similar to the LDPC decoder 140 of FIG. 1) is used. An LDPC codeword 320 is input to the LDPC decoder 310. Decoded bits 330 are output from the LDPC decoder 310. The LDPC decoder 310 uses an iterative decoding procedure 312 and a neural network 314 to process the input and generate the output.

In some embodiments, the LDPC codeword 320 does not match exactly the original encoded LDPC codeword. For example, suppose that x=[$x_0$, $x_1$, ..., $x_{N-1}$] is the original codeword that includes information bits and parity bits, and H=[$h_{i,j}$] is an M×N low-density parity-check matrix with a binary value $h_{i,j}$ at the intersection of row i and column j. Then each row of H provides a parity check for x. $xH^T$=0 because of the LDPC code construction. Assume that x is transmitted over and/or stored through a noisy channel. The corrupted channel output is Y=[$y_0$, $y_1$, ... $y_{N-1}$] and represents the codeword 320. y does not match x because of the channel noise.

In some embodiments, the decoded bits 330 include information bits. The information bits may not match the original information bits of x. A mismatch between two corresponding information bits represent an error bit. The number of error bits represent a BER. Nonetheless, the LDPC decoder 310 attempts to minimize the number of error bits and reduce the BER.

In some embodiments, the LDPC decoder 310 implements the iterative decoding procedure 312. For instance, the LDPC decoder 310 includes hardware and/or software that perform the iterative decoding procedure 312. Various iterative decoding procedures are possible. As illustrated in connection with FIGS. 2A and 2B, the iterative decoding procedure 312 involves a message passing algorithm in one example. An output of the iterative decoding procedure 312 is bits 316.

In an example, the bits 316 are generated based on message passing between variable nodes and check nodes. For instance, the bits 316 represent hard decision bits z=[$z_0$, $z_1$, ..., $z_{N-1}$]. The syndrome of z is a binary vector calculated by s=[$s_0$, $s_1$, ..., $s_{N-1}$]=$zH^T$, with a weight of $\|s\|$. The weight of $\|s\|$ represents the number of unsatisfied check nodes and is also called the checksum since $\|s\|=\Sigma_{i=0}^{M-1} s_i$. Suppose that $z^{(j)}$=[$z_0$, $z_1$, ..., $z_{N-1}$] is the hard decision of the j-th iteration and the syndrome vector of the j-th iteration is $s^{(j)}$=[$s_0^{(j)}$, $s_1^{(j)}$, ..., $s_{N-1}^{(j)}$)]=$z^{(j)}H^T$. Then $\|s\|^{(j)}$ is the checksum of the j-th iteration.

The LDPC decoder 310 can also generate a feature map 317 for each of the bits 316. The feature map 317 of a bit that is associated with a variable node includes a number of features. For example, the feature map 317 is a feature vector, where the features are elements of this vector. Some of the features relate to unsatisfied check nodes. For example, the feature map 317 includes the total number of unsatisfied check nodes connected to the variable node, the total number of unsatisfied nodes across the variable nodes. Some of the features also relate to the bit itself and to the decoding iteration. For example, the feature map 317 includes the current number of the decoding iteration (e.g., 'j' for the j-th iteration) and the available soft information about the bit (e.g., reliability information, LLR, decision for a detected bit, or other information available to a soft decoder). Some of the features also relate to other bits. For example, the variable node of the bit is connected to a particular unsatisfied check node that, in turn, is connected to a second variable node that corresponds to a second bit. Information about the second bit and/or the second variable node can be included in the feature map 317 of the bit. For example, the feature map 317 also includes the total number of unsatisfied check nodes connected to the second variable node and/or soft information about the second bit.

The LDPC decoder 310 inputs a feature map 317 of a bit to the neural network 314. An output of the neural network 314 is an indication 318 whether the bit should be flipped. If the indication 318 is to flip the bit, the LDPC decoder 310 flips the bit. Otherwise, the bit is not flipped. Once the iterative decoding and bit flipping complete, the LDPC decoder outputs the decoded bits 330.

In an example, the LDPC decoder 310 generates and inputs a feature map 317 for each bit to the neural network 314 to receive a corresponding indication 318. In another example, the LDPC decoder 310 selects particular bits and only generates and/or inputs a feature map 317 for each of those selected bits (instead of all of the bits). For instance, a particular bit has a particular variable node. If that variable node is connected to an unsatisfied check node, the LDPC decoder 310 generates a feature map 317 for the particular bit and inputs this feature map 317 to the neural network 314. Otherwise, the feature map 317 is not generated and/or is not provided as input to the neural network 314.

In some embodiments, the LDPC decoder 310 hosts the neural network 314. For example, hardware and/or software that implement the operations of the neural network 314 are components of the LDPC decoder 310. In other embodiments, the LDPC decoder 310 has access to, but does not host, the neural network 314. For example, the hardware and/or software that implement the operations of the neural network 314 are not components of the LDPC decoder 310, but can be components of an error correction system (e.g., the error correction system 100 of FIG. 1). In such embodiments, an interface exists between the LDPC decoder 310 and the neural network 314 (e.g., an application program interface (API), a communication bus, etc.) such that a feature map 317 can be sent from the LDPC decoder 310 to the neural network 314 and an indication 318 of whether to flip a corresponding bit can be received by the LDPC decoder 310 from the neural network 314.

In some embodiments, an indication 318 of whether to flip a bit or not is a hard decision. For example, the indication 318 is a flag, where a "1" value indicates that the bit should be flipped and a "0" value indicates otherwise. In this case, the LDPC decoder 310 flips the bit based on the "1" or "0" value of the flag. In other embodiments, the indication 318 is a soft decision. For example, the indication 318 is a prediction that includes the flag and the associated likelihood of the value in the flag being correct. In this case, the LDPC decoder 310 also uses the likelihood for the bit flipping. For instance, if the likelihood is over a certain predefined threshold (e.g., greater than 75% or some other percentage) and the flag is set to "1," the LDPC decoder 310 flips the bit.

Figure 4:
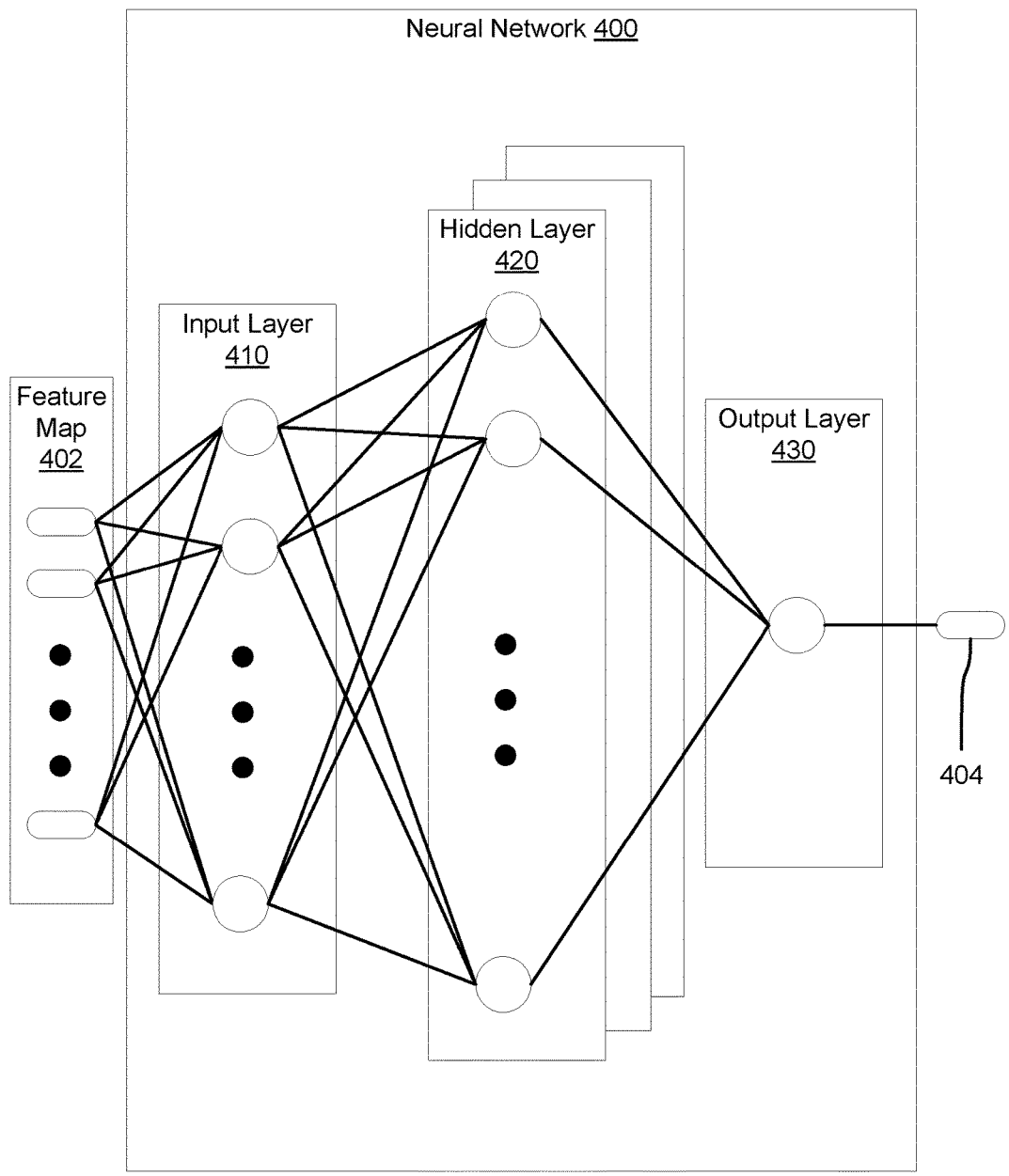
FIG. 4 illustrates an example neural network for generating an indication of whether a bit should be flipped or not, in accordance with certain embodiments of the present disclosure.

FIG. 4 illustrates an example neural network 400 for generating an indication of whether a bit should be flipped or not, in accordance with certain embodiments of the present disclosure. A feature map 402 associated with a bit is input to the neural network 400. In turn, the neural network 400 outputs an indication 404 about whether that bit should be flipped or not. As illustrated, the neural network 400 includes multiple layers. Features from the feature map 402 are connected to input nodes in an input layer 410 of the neural network. The indication 404 is generated from an output node of an output layer 430. One or more hidden layers 420 of the neural network 400 exist between the input layer 410 and the output layer 420. The neural network 400 is pre-trained to process the features from the feature map 402 through the different layers 410, 420, and 430 in order to output the indication 404.

In some embodiments, the neural network 400 is a multi-layer neural network that represents a network of interconnected nodes, such as an artificial deep neural network, where knowledge about the nodes (e.g., information about specific features represented by the nodes) is shared across layers and knowledge specific to each layer is also retained. Each node represents a piece of information. Knowledge can be exchanged between nodes through node-to-node interconnections. Input to the neural network 400 activates a set of node. In turn, this set of nodes activates other nodes, thereby propagating knowledge about the input. This activation process is repeated across other nodes until nodes in an output layer are selected and activated.

As illustrated, the neural network 400 includes a hierarchy of layers representing a hierarchy of nodes interconnected in a feed-forward way. The input layer 410 exists at the lowest hierarchy level, an input layer 410 exists. The input layer 410 includes a set of nodes that are referred to herein as input nodes. When the feature map 402 is input to the neural network 400, each of the input nodes of the input layer 410 is connected to each feature of the feature map. Each of the connections has a weight. These weights are one set of parameters that are derived from the training of the neural network 400. The input nodes transform the features by applying an activation function to these features. The information derived from the transformation are passed to the nodes at a higher level of the hierarchy.

The output layer 430 exists at the highest hierarchy level. The output layer 430 is mapped to one or more output nodes. Each output node provides specific information about a bit. As illustrated in FIG. 4, the output layer 430 includes a single output node. That provided information is the indication of whether the bit should be flipped or not.

The hidden layer(s) 420 exists between the input layer 410 and the output layer 430. The hidden layer(s) 420 includes "N" number of hidden layers, where "N" is an integer greater than or equal to one. In turn, each of the hidden layers also includes a set of nodes that are referred to herein as hidden nodes. Example hidden layers include up-sampling, convolutional, and data transformation layers.

At the lowest level of the hidden layer(s) 420, hidden nodes of that layer are interconnected to the input nodes. At the highest level of the hidden layer(s) 420, hidden nodes of that level are interconnected to the output node. The input nodes are not directly interconnected to the output nodes. If multiple hidden layers exist, the input nodes are interconnected to hidden nodes of the lowest hidden layer. In turn, these hidden nodes are interconnected to the hidden nodes of the next hidden layer and so on and so forth.

An interconnection represents a piece of information learned about the two interconnected nodes. The interconnection has a numeric weight that can be tuned (e.g., based on a training dataset), rendering the neural network 400 adaptive to inputs and capable of learning.

Generally, the hidden layer(s) 420 allows knowledge about the input nodes of the input layer 410 to be shared among the output nodes of the output layer 430. To do so, a transformation $f$ is applied to the input nodes through the hidden layer 420. In an example, the transformation $f$ is non-linear. Different non-linear transformations $f$ are available including, for instance, a rectifier function $f(x)=\max(0, x)$. In an example, a particular non-linear transformations $f$ is selected based on cross-validation. For example, given known example pairs $(x, y)$, where $x \in X$ and $y \in Y$, a function $f: X \rightarrow Y$ is selected when such a function results in the best matches.

The neural network 400 also uses a loss function l (or, referred to also as a cost function c) to find an optimal solution. The optimal solution represents the situation where no solution has a loss less than the loss of the optimal solution. In an example, the loss function l includes a mean-squared error function that minimizes the average squared error between an output $f(x)$ and a target value y over all the example pairs $(x, y)$. A backpropagation algorithm that uses gradient descent to minimize the loss function is used to train the neural network 400.

As such, the hidden layer(s) 420 retains knowledge about the input nodes. A set of knowledge is shared across the output nodes based on the interconnections of the hidden nodes and the input nodes.

Figure 5:
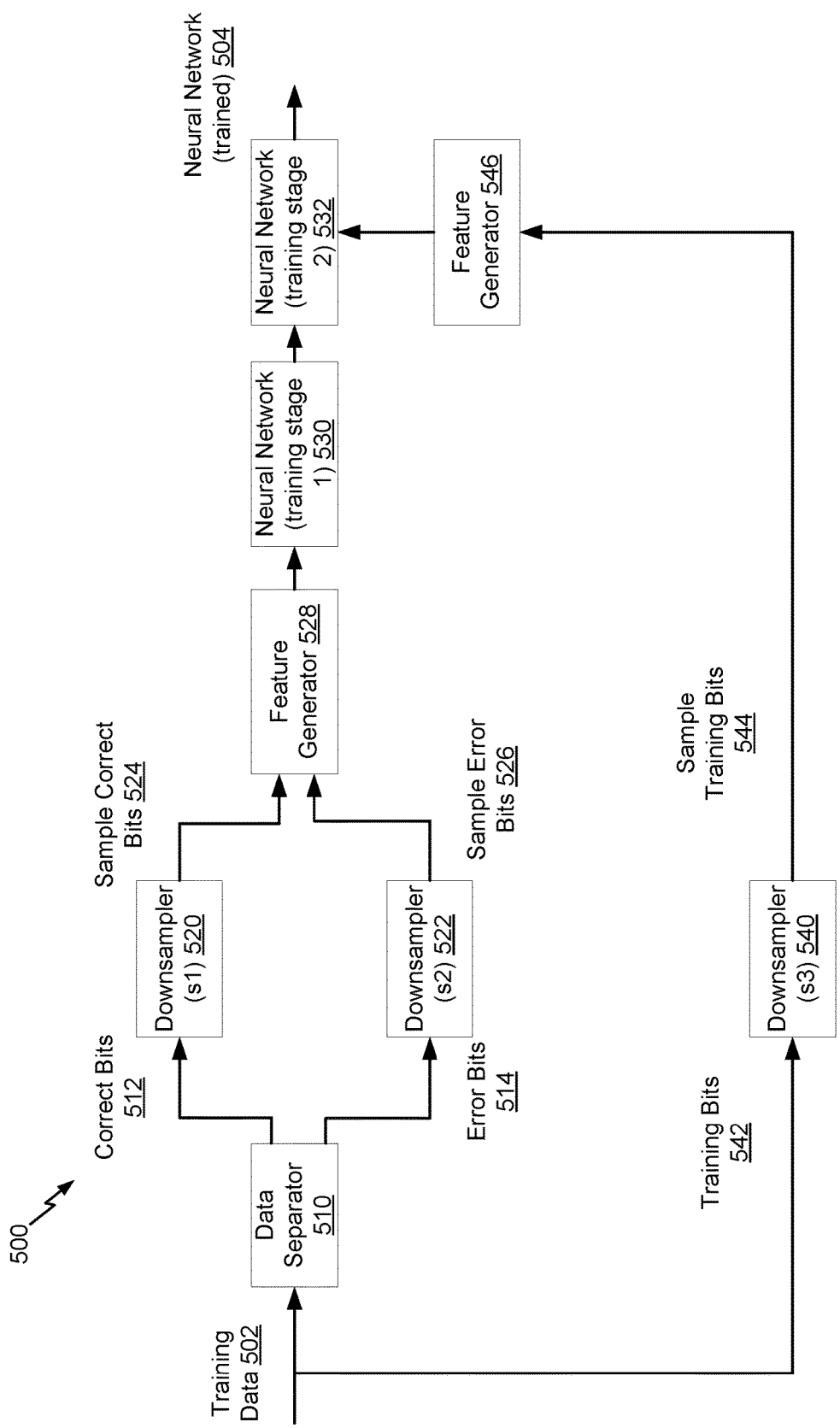
FIG. 5 illustrates an example diagram for training a neural network, in accordance with certain embodiments of the present disclosure.

FIG. 5 illustrates an example diagram 500 for training a neural network, in accordance with certain embodiments of the present disclosure. The illustrated components can be implemented in hardware and/or software and can be part of an offline system and/or online system. In an example, the offline system provides the training as a computing service. This service can be used to develop the configuration of the neural network (e.g., the number of hidden layers, number of nodes, etc.), train the neural network (e.g., to set the weights), and output the trained neural network for use by online systems. The training can be a single instance or can be continuous such that updates to the neural network (e.g., to its weights) can be pushed to the online systems. In comparison, an online system can include an error correcting system, such as the error correction system 100 of FIG. 1 and can train (as needed) and use the neural network.

Generally the training uses training data 502. At the end of the training, a neural network 504 is trained to output an indication whether a bit should be flipped or not based on an input feature map and available for actual use. As illustrated, the training can be performed in multiple stages. In a first stage, an untrained neural network 530 is trained with a subset of correct bits and error bits available from training bits and result in a partially-trained neural network 532. In a second stage, the partially-trained neural network 532 is further trained with a larger subset of the training bits. At the completion of the second training stage, the fully trained neural network 504 becomes available for use.

In some embodiments, the training data 502 includes a large number of training LDPC codewords (e.g., in the hundreds or thousands). Because training LDPC codewords are used, locations of error bits in the LDPC codewords are known.

In the first training stage, the training data 502 is input to a data separator 510 that separates, from the training LDPC codewords, the correct bits 512 in one set and the error bits 514 in another set given the known locations of the error bits 514. Subsequently, each set is sampled at a different rate. For example, a down-sampler 520 down-samples the correct bits 512 at a first sampling rate "$s_1$" to generate sample correct bits 524. A down-sampler 522 also down-samples the error bits 514 at a second sampling rate "$s_2$" to generate sample error bits 526. To improve the training and avoid improperly biasing the neural network 504 (e.g., by setting the weights such that it fails to properly detect the error bits that occur at a much lower rate than the correct bits), the second sampling rate "$s_2$" is smaller than the first sampling rate "$s_1$," such that the ratio of the amount of the sample correct bits 524 to the amount of sample error bits 526 is greater than the ratio of the amount of the correct bits 512 to the amount of sample error bits 514.

The sample correct bits 524 and the sample error bits 526 are input to a feature generator 528. The feature generator 528 generates for each of the bits a feature map. The feature maps are then input to the untrained neural network 530. As illustrated in connection with FIG. 4, a loss function and a backpropagation algorithm can be used to train the untrained neural network 530 given the input feature maps. At the end of this first training stage, the untrained neural network 530 becomes the partially-trained neural network 532.

In the second training stage, the training data 502 is input to a down-sampler 540 and can commence before the completion of the first training stage. The training data includes all training bits 542 from the training LDPC codewords. The down-sampler 540 down-samples the training bits 542 at a third sampling rate "$s_3$" to generate sample training bits 544. In turn, the sample training bits 544 are input to a feature generator 546 that generates a feature map for each of the sample training bits 544. The feature maps are then input to the partially-trained neural network 532. The same or different loss function and backpropagation algorithm can be used to further train the partially-trained neural network 532 given the input feature maps. At the end of this second training stage, the partially-trained neural network 532 becomes the fully-trained neural network 504.

In some embodiments, the sampling rates "$s_1$," "$s_2$," and "$s_3$" are set based on a particular BER. For example, the neural network 504 is trained for the particular BER. The training data includes error bits that correspond to the particular BER. The neural network 504 is trained using different sets of the sampling rates. The set that best achieves the BER is used.

Although FIG. 5 illustrates the different components as being separate, other implementations of the components are possible. For example, a single down-sampler that operates at multiple sampling rates can be used in lieu of the down-samplers 520, 522, and 540. Similarly, a single feature generator can be used in lieu of the feature generators 528 and 546.

Figure 6:
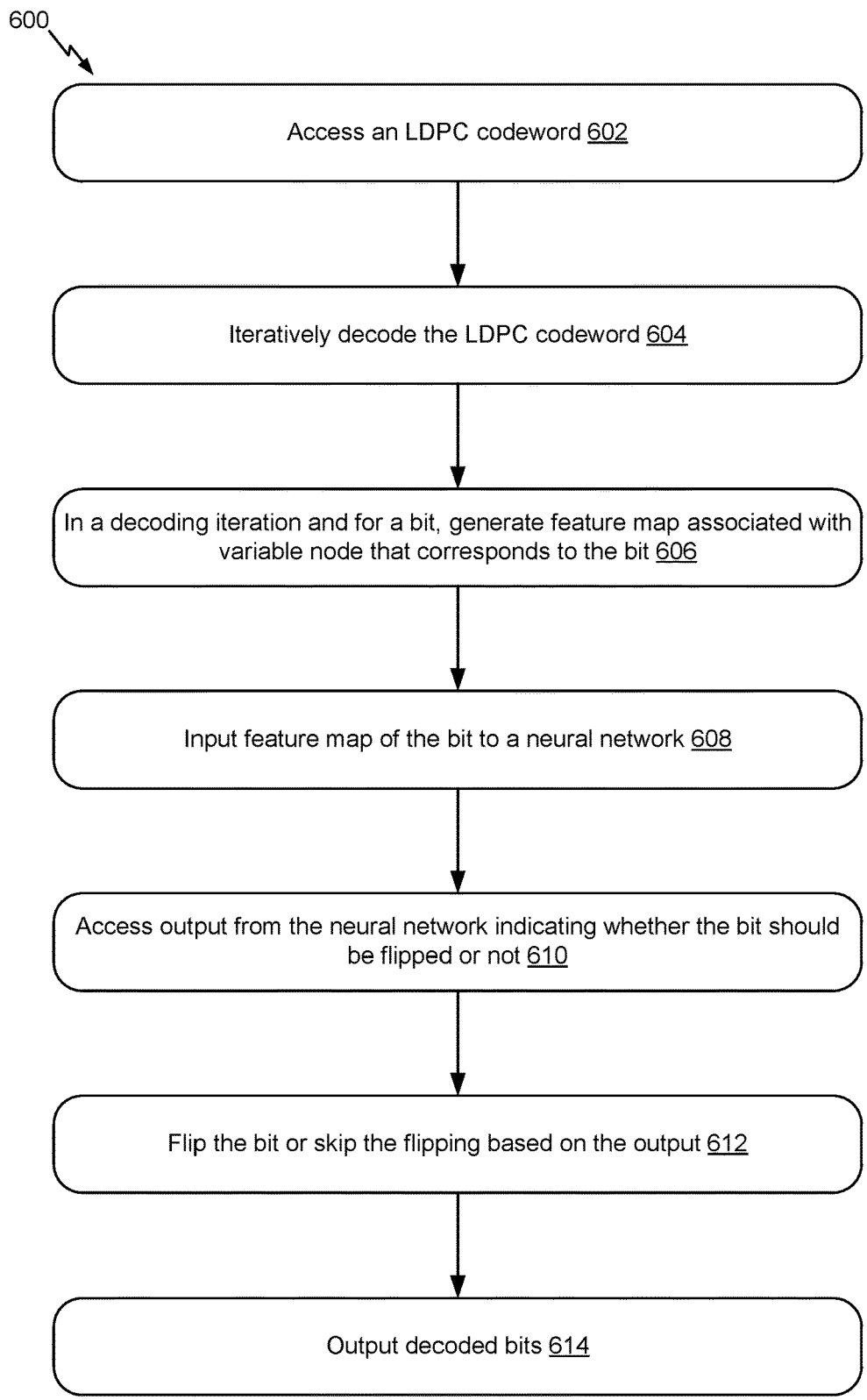
FIG. 6 illustrates an example flow for an LDPC iterative decoding that uses a neural network, in accordance with certain embodiments of the present disclosure.
Figure 7:
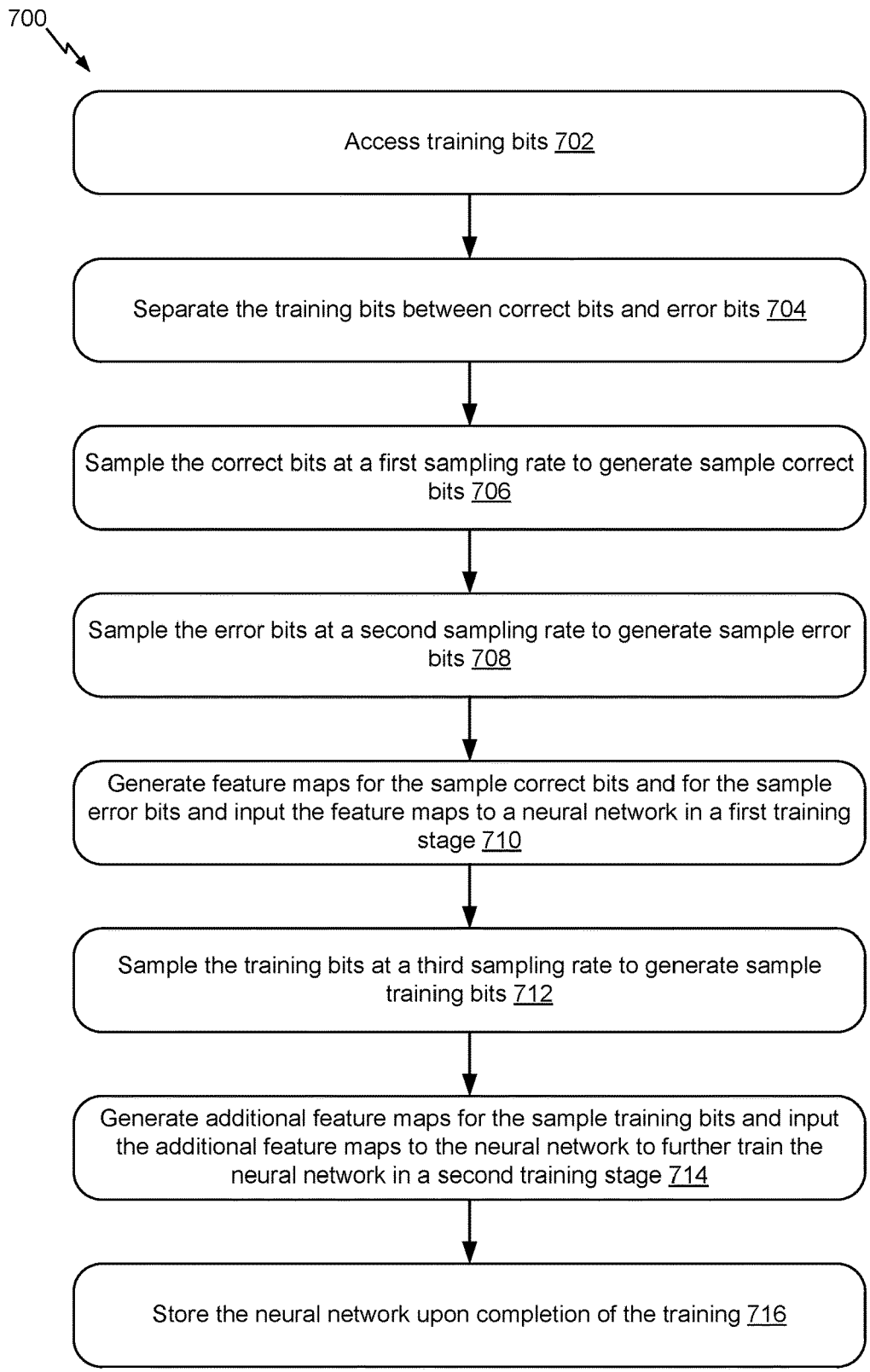
FIG. 7 illustrates an example flow for training a neural network, in accordance with certain embodiments of the present disclosure.
Figure 8:
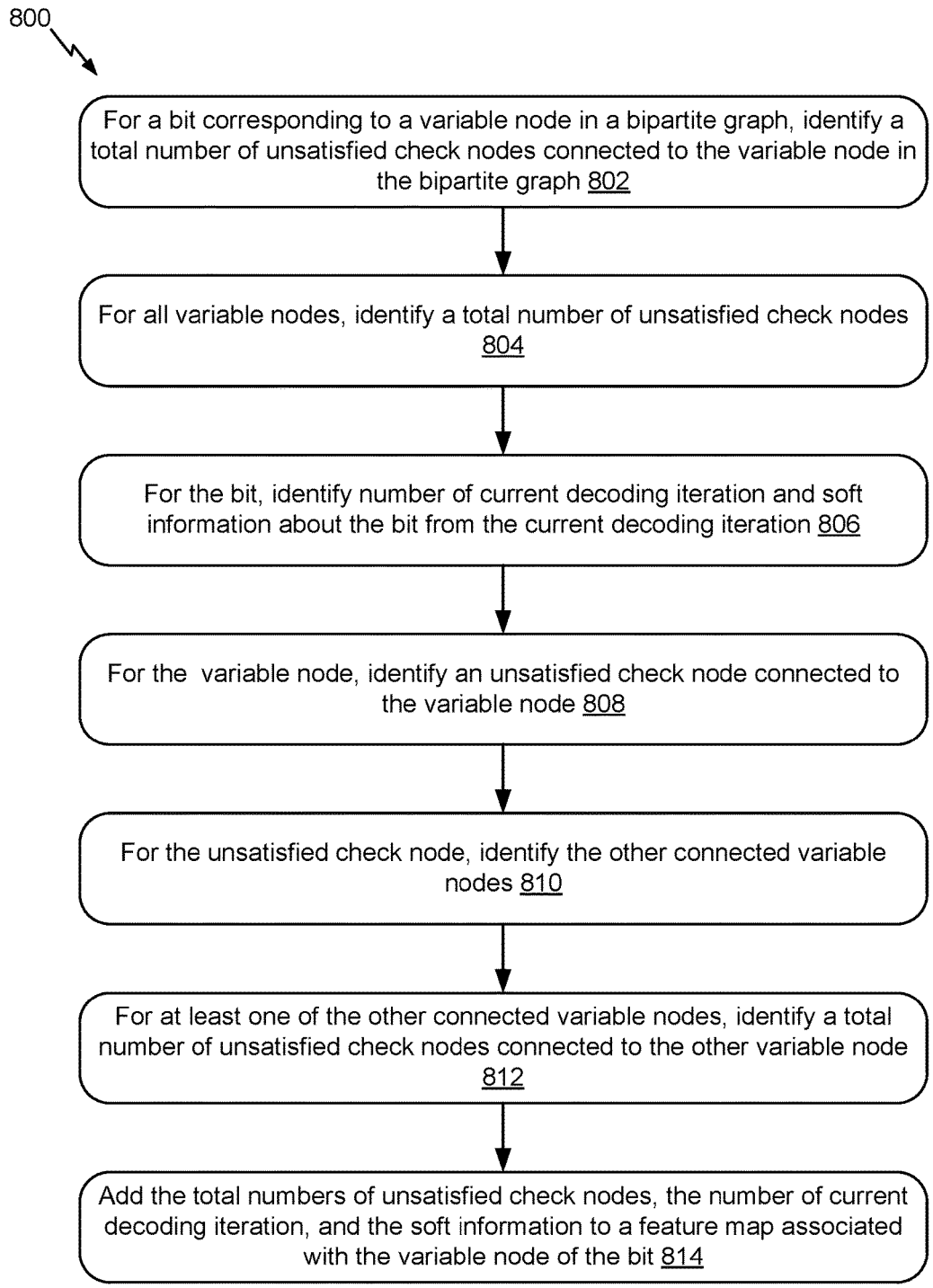
FIG. 8 illustrates an example flow for generating a feature map, in accordance with certain embodiments of the present disclosure.

FIGS. 6-8 illustrate example flows for decoding a codeword, such as an LDPC codeword, based on a neural network. A system is described as performing particular operations of the example flows. In particular, the system implements an error correcting system that includes a decoder, such as the error correcting system 100 of FIG. 1. The system may have a specific hardware configuration to perform the operations of the error correcting system, including those of the decoder (e.g., an iterative decoder such as the LDPC decoder 140 of FIG. 1). Alternatively or additionally, the system may include generic hardware configured with specific instructions. In an example, the system includes one or more processors and one or more memories. The memory(ies) stores computer-readable instructions to embody functionalities specific to the system. The instructions when executed by the processor(s) of the system result in performance of the functionalities by the system. The instructions stored in the memory(ies) in conjunctions with the underlying processor(s) represent means for performing the functionalities. Some of the operations across the example flows are similar. In the interest of brevity, the similarities are not repeated herein. Further, although the operations are illustrated in a particular order, other arrangements of the operations are possible and some of the operations may be skipped as it would be apparent to a person skilled in the art.

FIG. 6 illustrates example flow 600 for an LDPC iterative decoding that uses the neural network, in accordance with certain embodiments of the present disclosure. As illustrated, the example flow 600 starts at operation 602, where the system accesses an LDPC codeword. For example, the LDPC codeword is accessed from storage in response to a request for information bits stored in the storage. The information bits were encoded using an LDPC encoding process and stored in the storage.

At operation 604, the system iteratively decodes the LDPC codeword. For example, the system implements (or, more specifically, the decoder uses) a hard or soft iterative LDPC decoding procedure and inputs the LDPC codeword to such a procedure. The iterative decoding procedure, whether soft or hard, involves bit flipping. The bit flipping can occur within each decoding iteration or within a set of such decoding iterations. The bit flipping involves the use of a properly trained neural network, as further described in connection with the next operations and the next figures.

At operation 606, the system, in a decoding iteration and for a bit, generates a feature map associated with a variable node that corresponds to the bit. This operation can be repeated within each decoding iteration or within a set of such decoding iterations. This operation can also be repeated for all the bits of the LDPC codewords or, alternatively, for a selected set of the bits. If operation 606 is performed for only selected bit(s), a bit can be selected based on its variable node. For instance, the system (or, more specifically, the decoder) selects a variable node that is connected to at least one unsatisfied check node because the bit of this variable node is a candidate for flipping. On the other hand, if a variable node is not connected to any unsatisfied check node, the system (or, more specifically, the decoder) does not select the bit of this variable node. The feature map of a bit includes features that relate to unsatisfied check nodes, relate to the bit itself and to the decoding iteration, and to other bits associated with unsatisfied check nodes, as illustrated in connection with the feature map 317 of FIG. 3. FIG. 8 illustrates an example flow for generating such a feature map.

At operation 608, the system inputs the feature map of the bit to a neural network. This operation can be repeated for the various feature maps generated at operation 606 at the different decoding iterations. In an example, the neural network includes an input layer that has a number of input nodes. The system (or, more specifically, the decoder) provides the feature maps as an input to the input layer. Each feature in the feature map is connected with each input node and each connection is weighted.

At operation 610, the system accesses an output from the neural network. The output indicates whether the bit should be flipped or not. The output can be a soft decision or a hard decision about bit flipping. This operation can be repeated for the various feature maps that are input at operation 608 at the different decoding iterations. In an example, the neural network includes an output layer that has an output node. The output node generates the indication based on the propagation of information about the features of the input feature map from the input layer and through one or more hidden layers. The indication is stored in memory of the system and/or provided as input to the LDPC decoder.

At operation 612, the system flips the bit or skips the bit flipping based on the output. For example, if the output indicates that the bit should be flipped (whether a hard decision to flip or a soft decision indicating that the flipping is associated with a likelihood that is equal to or greater than a predefined threshold), the system (or, more specifically, the decoder) flips the bit. Otherwise, the bit is not flipped. This operation can be repeated for each bit for which an output from the neural network exists and across the applicable decoding iterations.

At operation 614, the system outputs decoded bits. In an example, the iterative decoding and the bit flipping are complete. The system (or, more specifically, the decoder) outputs the decoded codeword that includes the bits decoded according to the iterative decoding and to the bit flipping.

FIG. 7 illustrates an example flow 700 for training the neural network, in accordance with certain embodiments of the present disclosure. Whereas the example flow 600 of FIG. 6 is typically performed by an online system, the example flow 700 can be performed by the same online system or by an offline system. Hence, the "system" described in connection with FIG. 7 refers to either the online system or the offline system.

The example flow 700 starts at operation 702, where the system accesses training bits. In an example, the neural network is trained for a particular BER. The training bits are bits from training LDPC codewords that include errors at known locations, where the ratio of error bits to correct bits corresponds to the BER. Such training bits can be available from the memory of the system.

At operation 704, the system separates the training between correct bits and error bits. In an example, the locations of the error bits in the training LDPC codewords are known. The system accesses the error bits from these locations and generates a set that includes the error bits. The remaining set include the correct bits.

At operation 706, the system samples the correct bits at a first sampling rate to generate sample correct bits. In an example, the system uses sub-sampling at the first sampling rate. The sub-sampling can randomly select a subset of the correct bits. This subset is the set of the sample correct bits.

At operation 708, the system samples the error bits at a second sampling rate to generate sample error bits. In an example, the system uses sub-sampling at the second sampling rate. The sub-sampling can randomly select a subset of the error bits. This subset is the set of the sample error bits. Generally, the second sampling rate is smaller than the first sampling rate to improve the training of the neural network.

At operation 710, the system generates feature maps for the sample correct bits and for the sample error bits and inputs, in a first training stage, the feature maps to the neural network. In an example, each of the feature maps corresponds to a sample correct bit or a sample error bit. Such a bit is available from a training LDPC codeword. This training codeword was subject to iterative decoding in a controlled or simulation environment such that various decoding information about the bit and the corresponding variable node is known. The feature map for the bit is derived from such information, as further described in connection with FIG. 8. As illustrated in connection with FIG. 4, a loss function and a backpropagation algorithm can be used to train the neural network given the input feature maps.

At operation 712, the system samples the training bits at a third sampling rate to generate sample training bits. In an example, the system uses sub-sampling at the third sampling rate. The sub-sampling can randomly select a subset of the original training bits. This subset is the set of the sample training bits.

At operation 714, the system generates feature maps for the sample training bits and inputs, in a second training stage, the feature maps to further train the neural network. In an example, each of the feature maps corresponds to a sample training bit. Such a bit is available from a training LDPC codeword. This training codeword was subject to iterative decoding in the controlled or simulation environment such that various decoding information about the bit and the corresponding variable node is known. The feature map for the bit is derived from such information, as further described in connection with FIG. 8. As illustrated in connection with FIG. 4, a loss function and a backpropagation algorithm can be used to further train the neural network given the input feature maps.

At operation 716, the system stores the neural network upon completion of the training. The neural network is stored in a storage location available or local to an online system (if different from the system). In an example, parameters of the neural network, such as the number of layers, the number of nodes in each layer, the weights between the connections, and other relevant parameters are stored.

FIG. 8 illustrates an example flow 800 for generating a feature map, in accordance with certain embodiments of the present disclosure. The feature map is generated for a bit. The bit can be a training bit or an actual bit being decoded. A feature map for a training bit is generated during the training of a neural network. Accordingly, a system responsible for the training generates the feature map for the training bit. To do so, the training bit is available from a training codeword that was subject to iterative decoding in the controlled or simulation environment. Various decoding information about the training bit and about the corresponding variable node is known from this environment. In comparison, a feature map for a bit being decoded is generated during the actual decoding of an LDPC codeword. Accordingly, a system responsible for the decoding generates the feature map for this bit. To do so, various decoding information is available from the decoding of the bit. Such information is used to generate the feature map. The process for generating a feature map is similar for a training bit and for a bit being decoded. Of course, the main difference is the source of information used to generate the feature map. The example flow 800 applies to both types of bits.

The example flow 800 starts at operation 802, where the system identifies, for a bit (whether a training bit or a bit being decoded), a total number in a decoding iteration of unsatisfied check nodes connected to a variable node in a bipartite graph (e.g., whether this graph is used to generate training LDPC codewords at a particular BER or during an actual decoding). The variable node corresponds to the bit. A check node is connected to the variable node and to other variable nodes, each of which corresponds to a different bit. This check node is unsatisfied if the modulo sum of the bits corresponding to the connected variable nodes is not zero. Hence, the system identifies, for the variable node, the check nodes connected thereto and determines which of these check nodes is unsatisfied, and tracks the total number of these connected but unsatisfied check nodes.

At operation 804, the system identifies, for all variable nodes, a total number of unsatisfied check nodes. In comparison to operation 802, where the total number is determined per variable node, in operation 804, this total number represents a count of all the unsatisfied check nodes in the bipartite graph at the decoding iteration.

At operation 806, the system identifies, for the bit, the number of the current decoding iteration and soft information about the bit from the current decoding iteration. For example, the system maintains, in its memory, a count "j" of the current decoding iteration. This count represents the number. Further, the system also maintains, in its memory, reliability information, LLR, decision for a detected bit, or other decoding-related information about the bit available from the current decoding iteration. Hence, the number of the current decoding iteration and the soft information about the bit can be identified from the memory of the system.

At operation 808, the system identifies, for the variable node that corresponds to the bit, an unsatisfied check node that is connected to the variable node. For example, this check node is identified based on the bipartite graph and on the relevant parity-check equation. This operation can be repeated for the various unsatisfied check nodes connected to the variable node.

At operation 810, the system identifies, for the unsatisfied check node, the other variable nodes connected to this check node. For example, each of such variable nodes is identified based on the bipartite graph.

At operation 812, the system identifies, for at least one of the other connected variable nodes, a total number of unsatisfied check nodes that are connected to this other connected variable node. For example, the system identifies a second variable node that is connected to the unsatisfied check node. The system then performs an operation similar to operation 802 to identify the total number of unsatisfied check nodes that are connected to the second variable node.

At operation 814, the system adds the total numbers of unsatisfied check nodes, the number of the current decoding iteration, and the soft information to the feature map associated with the variable node of the bit. For example, the feature map is a feature vector, where the elements of the vectors are the various features. The system includes the total number of unsatisfied check nodes identified for the bit as one feature. The system includes the total number of unsatisfied check nodes identified for all variable nodes as another feature. The system further includes the current number of the decoding iteration as yet another feature. The system also includes each type of soft information as one separate feature. Additionally, the system includes the total number of unsatisfied check nodes identified for each of the other bits as a separate feature.

Figure 9:
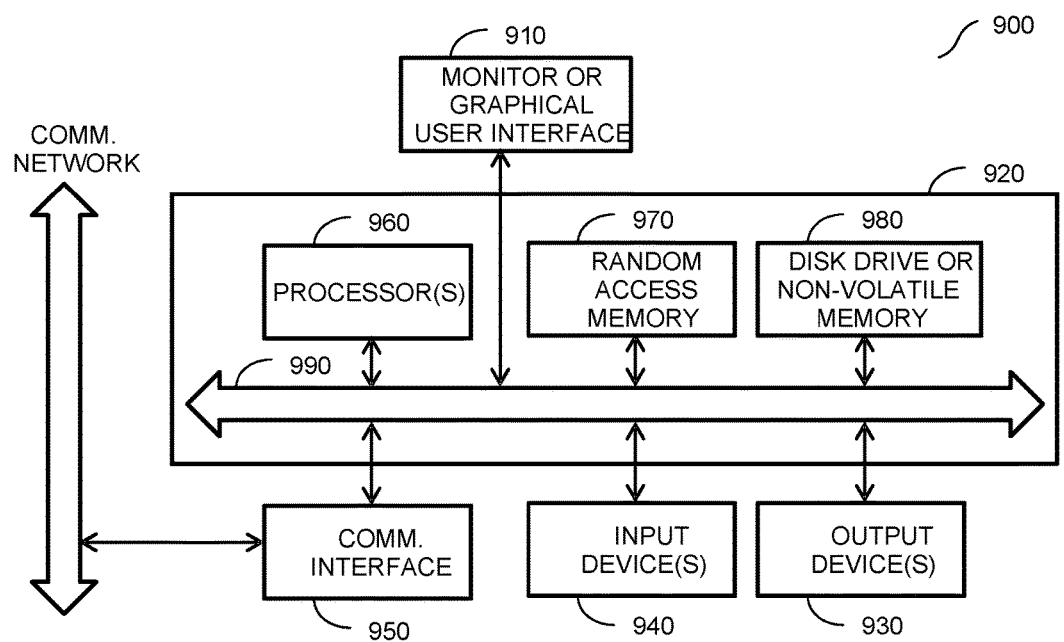
FIG. 9 is representative of a computer system capable of embodying the present disclosure.

FIG. 9 describes one potential implementation of a system, which may be used according to one embodiment, such as the error correction system 100 of FIG. 1. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like. The error correction system 100 of FIG. 1 implements some or all of the components of the computer system 900.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 940 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 940 are typically embodied as a computer mouse, a trackball, a track pad, a joystick, a wireless remote, a drawing tablet, a voice command system, an eye tracking system, and the like. The user input devices 940 typically allow a user to select objects, icons, text and the like that appear on the monitor 910 via a command such as a click of a button or the like.

The user output devices 930 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the disk drive 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes.

The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method of decoding a low-density parity-check (LDPC) code based on a bit-flipping procedure, the method comprising:
   accessing, by a system, an LDPC codeword from a computer memory; and
   iteratively decoding, by the system, the LDPC codeword to output decoded bits from the computer memory at an improved bit error rate, wherein, in a decoding iteration, the decoding comprises:
      generating a feature map for a bit of the LDPC codeword, the bit corresponding to a variable node;
      inputting the feature map to a neural network trained for bit flipping, the feature map corresponding to at least input nodes of an input layer of the neural network;
      accessing an output of the neural network, the output indicating that the bit should be flipped based on the feature map of the bit, the output corresponding to at least an output node of an output layer of the neural network; and
      flipping the bit in the decoding iteration based on the output from the neural network.

2. The method of claim 1, wherein the neural network is trained based on a first training stage, wherein in the first training stage:
   training bits are separated between correct bits and error bits,
   the correct bits are sampled at a first sampling rate to generate sample correct bits;
   the error bits are sampled at a second sampling rate to generate sample error bits; and
   the sample correct bits and the sample error bits are input to the neural network.

3. The method of claim 2, wherein the first sampling rate is larger than the second sampling rate.

4. The method of claim 3, wherein the neural network is trained for a particular bit error rate (BER), and wherein the first sampling rate and the second sampling rate are set based on the particular BER.

5. The method of claim 2, wherein the neural network is further trained based on a second training stage, wherein in the second training stage:
   the training bits are sampled at a third sampling rate to generate sample training bits; and
   the sample training bits are input to the neural network.

6. The method of claim 5, wherein feature maps corresponding to the sample correct bits and to the sample error bits are input to the neural network in the first training stage, and wherein feature maps corresponding to the sample training bits are input to the neural network in the second training stage only after completion of the first training stage.

7. The method of claim 1, wherein the feature map comprises a total number of unsatisfied check nodes in the decoding iteration and a total number of unsatisfied check nodes connected to the variable node in the decoding iteration.

8. The method of claim 7, wherein generating the feature map comprises:
   identifying an unsatisfied check node connected to the variable node;
   identifying a second variable node connected to the unsatisfied check node;
   determining a second total number of unsatisfied check nodes connected to the second variable node, and
   adding the second total number of unsatisfied check nodes to the feature map of the variable node.

9. The method of claim 7, wherein the feature map further comprises a current number of the decoding iteration and soft information about the bit available from the decoding iteration.

10. The method of claim 1, wherein the decoding further comprises, in a next decoding iteration:
    updating the feature map of the bit based on unsatisfied check nodes in the next decoding iterations;
    inputting the updated feature map to the neural network;
    accessing a second output from the neural network, the second output indicating that the bit should not be flipped based on the updated feature map; and
    skipping the flipping of the bit in the next decoding iteration based on the second output from the neural network.

11. The method of claim 1, wherein the decoding further comprises, in the decoding iteration and for a second bit corresponding to a second variable node:
    identifying an unsatisfied check node that is connected to the second variable node;
    based on a determination that the variable node is also connected to the unsatisfied check node, determining a total number of unsatisfied check nodes connected to the variable node;
    adding to the total number of unsatisfied check nodes to a second feature map of the second bit;
    inputting the second feature map to the neural network;
    accessing a second output from the neural network, the second output indicating that the second bit should be flipped based on the second feature map; and
    flipping the second bit in the decoding iteration based on the second output from the neural network.

12. A non-transitory computer storage medium storing instructions that are associated with a low-density parity-check (LDPC) decoder and that, upon execution by a processor of a system, cause the system to perform operations associated with iterative decoding of an LDPC codeword to output decoded bits at an improved bit error rate, the operations comprising:
    in a decoding iteration:
       generating a feature map for a bit of the LDPC codeword, the bit corresponding to a variable node;
       inputting the feature map to a neural network trained to determine whether bits should be flipped based on corresponding feature maps, the feature map corresponding to at least input nodes of an input layer of the neural network;
       accessing an output of the neural network, the output indicating that the bit should be flipped based on the feature map of the bit, the output corresponding to at least an output node of an output layer of the neural network; and
       flipping the bit in the decoding iteration based on the output from the neural network.

13. The non-transitory computer storage medium of claim 12, wherein the LDPC codeword is an irregular LDPC codeword.

14. The non-transitory computer storage medium of claim 12, wherein the feature map comprises features associated with the variable node, wherein an input layer of the neural network comprises input nodes, wherein each input node is connected to the features from the feature map, and wherein each connection between an input neural and a feature is weighted.

15. The non-transitory computer storage medium of claim 12, wherein an output layer of the neural network comprises an output node that generates a decision about flipping the bit or not.

16. The non-transitory computer storage medium of claim 12, wherein the neural network is trained based on an input to the neural network that includes features maps associated with sample correct bits and with sample error bits, wherein:
the sample correct bits are generated from a sampling of correct bits at a first sampling rate;
the sample error bits are generated from a sampling of error bits at a second sampling rate, wherein the second sampling rate is smaller than the first sampling rate; and
the correct bits and the error bits are generated based on a separation of training bits between the correct bits and the error bits.

17. The non-transitory computer storage medium of claim 16, wherein, after the neural network is trained based on the input, the neural network is further trained based on an additional input, wherein the additional input comprises feature maps associated with sample training bits generated from the training bits at a third sampling rate.

18. A system to improve the bit error rates of decoded bits, comprising:
a processor; and
a memory comprising computer-readable instructions associated with a low-density parity-check (LDPC) decoder, the instructions upon execution by the processor cause the system to:
train a neural network to determine, based on feature maps associated with variable nodes that correspond to bits, whether the bits should be flipped; and
store the neural network in storage accessible to the LDPC decoder, wherein, in a decoding iteration of the LDPC decoder, a bit is flipped based on:
an input to the neural network, the input comprising a feature map associated with a variable node that corresponds to the bit, the feature map corresponding to at least input nodes of an input layer of the neural network; and
an output of the neural network indicates that the bit should be flipped based on the input, the output corresponding to at least an output node of an output layer of the neural network.

19. The system of claim 18, wherein training the neural network comprises:
separating training bits between correct bits and error bits,
sampling the correct bits at a first sampling rate to generate sample correct bits;
sampling the error bits at a second sampling rate to generate sample error bits, the second sampling rate being smaller than the first sampling rate;
generating feature maps from the sample correct bits and the sample error bits; and
inputting the feature maps to the neural network.

20. The system of claim 19, wherein training the neural network further comprises:
sampling the training bits at a third sampling rate to generate sample training bits;
generating additional feature maps from the sample training bits; and
inputting the additional feature maps to the neural network.

* * * * *